US012753303B2

(12) United States Patent
Qi et al.

(10) Patent No.: US 12,753,303 B2
(45) Date of Patent: Oct. 6, 2026

(54) MODIFIED RESIN COMPOSITION, PREPARATION METHOD THEREFOR AND USE THEREOF

(71) Applicant: GUANGDONG HINNO-TECH CO., LTD., Guangzhou (CN)

(72) Inventors: Xiaolong Qi, Guangzhou (CN); Rongnuan Huang, Guangzhou (CN); Xinquan Zhang, Guangzhou (CN); Kemmei Fuse, Guangzhou (CN)

(73) Assignee: Guangdong Hinno-Tech Co., LTD., Guangzhou (CN)

( * ) Notice: Subject to any disclaimer, the term of this patent is extended or adjusted under 35 U.S.C. 154(b) by 608 days.

(21) Appl. No.: 18/269,076

(22) PCT Filed: Jul. 30, 2021

(86) PCT No.: PCT/CN2021/109676
§ 371 (c)(1),
(2) Date: Jun. 22, 2023

(87) PCT Pub. No.: WO2022/134590
PCT Pub. Date: Jun. 30, 2022

(65) Prior Publication Data

US 2024/0059888 A1 Feb. 22, 2024

(30) Foreign Application Priority Data

Dec. 22, 2020 (CN) ........................ 202011527355.8

(51) Int. Cl.
*C08L 63/00* (2006.01)
*C08J 5/24* (2006.01)
*H05K 1/03* (2006.01)

(52) U.S. Cl.
CPC ............... *C08L 63/00* (2013.01); *C08J 5/244* (2021.05); *H05K 1/0366* (2013.01); *C08J 2363/00* (2013.01); *C08J 2471/02* (2013.01)

(58) Field of Classification Search
CPC ........... C08L 63/00; C08L 71/00; C08J 5/244; C08J 2363/00; C08J 2471/02; C08J 5/249; C08J 2471/00; H05K 1/0366; H05K 1/0353; C08G 2650/56; C08G 59/4021; C08G 59/5073; C08G 59/686; Y02T 50/40; C08K 3/36
See application file for complete search history.

(56) References Cited

U.S. PATENT DOCUMENTS 9,803,111 B2 10/2017 Honda et al.
10,385,185 B2 8/2019 Takada
2005/0127319 A1* 6/2005 Fujioka .................. H01G 11/62 429/339
2006/0159929 A1* 7/2006 Tanaka ................... C08G 59/26 428/297.4
2013/0109785 A1 5/2013 Endo et al.
2015/0048495 A1 2/2015 Honda et al.
2015/0337075 A1* 11/2015 Oshima .................. C08G 59/42 523/466
2016/0244590 A1* 8/2016 Takada ................... C08G 59/40
2019/0284395 A1 9/2019 Kasahara et al.

FOREIGN PATENT DOCUMENTS

CN 104137240 A 11/2014
CN 105683284 A 6/2016
CN 108676533 A 10/2018
CN 109749360 A 5/2019
CN 109757023 A 5/2019
CN 112662132 A 4/2021

OTHER PUBLICATIONS

Mitsubishi Chemical Group (jER epoxy resin) (Year: 2025).*
Yu, (Effect of Organosilane Coupling Agents on Microstructure and Properties of Nanosilica/Epoxy Compsites, Polymer Composites 2012 pp. 1516-1524). (Year: 2012).*
International Search Report and Written Opinion, and English Translation thereof, for International Application No. PCT/CN2021/109676, mailed Sep. 28, 2021, (15 pages).
First Chinese Office Action, and English Translation thereof, for Counterpart Chinese Application No. 202011527355.8, mailed Jul. 25, 2022, (15 pages).
Second Chinese Office Action for Counterpart Chinese Application No. 202011527355.8, mailed Feb. 9, 2023, (6 pages).
Zhai et al., "Preparation of nano-SiO2 and its application in epoxy resin," China Adhesives, vol. 18. No. 6, pp. 62-65, Jun. 30, 2008, (4 pages). (English Abstract attached. See Search Report for PCT/CN2021/109676).
Ning, "Chemistry and Applied Chemistry Postgraduate Teaching Book Advanced Inorganic Synthesis," East China University of Science and Technology, pp. 135-136, Sep. 30, 2007, (5 pages). (English Abstract attached. See Second Chinese Office Action 202011527355.8).
Qu, "Plastic Handbook," Ordnance Industry Press, pp. 413-416, Feb. 28, 1991, (7 pages). (English Abstract attached. See Second Chinese Office Action 202011527355.8).
Extended European Search Report for European Counterpart Application No. 21908595.8, mailed Apr. 4, 2024, (6 pages).

* cited by examiner

*Primary Examiner* — Doris L Lee
(74) *Attorney, Agent, or Firm* — Kagan Binder, PLLC

(57) ABSTRACT

The present disclosure provides a modified resin composition, a preparation method and use thereof. The raw materials of the modified resin composition includes: 65 to 100 parts by mass of a matrix resin, 10 to 40 parts by mass of a phenoxy resin, 0.5 to 25 parts by mass of nano silicon dioxide, 2 to 15 parts by mass of a curing agent, 0 to 2 parts by mass of a curing accelerator, and 0 to 1 part by mass of a coupling agent.

19 Claims, No Drawings

MODIFIED RESIN COMPOSITION, PREPARATION METHOD THEREFOR AND USE THEREOF

TECHNICAL FIELD

The present disclosure relates to the technical field of composite resin, and particularly to a modified resin composition and a preparation method and use thereof.

BACKGROUND

With the rapid development of electronic industry, electronic products are developing towards miniaturization, multi-function and high security. Therefore, printed circuit boards (PCBs) are required to be high density and multi-performances, and to meet the needs of three-dimensional installation of electronic products. Accordingly, more and more attention is being paid to the use of rigid-flex combination technology, which involves bonding a rigid circuit board and a flexible circuit board with a bonding material to prepare a printed circuit board.

In recent years, technicians have increasingly considered the use of a no-flow prepreg as a bonding material for bonding a rigid PCB and a flexible PCB. When the no-flow prepreg is B-stage resin without being cured by hot pressing, the resin does not flow or flows very little at high temperature and high pressure, and has good bonding performance. Before pressing, the prepreg needs to be mechanically punched according to the shape and structure of the printed circuit board product, and then stacked and pressed with a rigid printed circuit board and a flexible printed circuit board. A rubber-toughened epoxy resin is usually used as the main resin material in the traditional no-flow prepreg, through which, although the prepreg that does not flow or flow very little can be obtained, the punched edge of the prepreg is cracked greatly during the process of mechanical punching. This is an adverse effect on the subsequent processability and heat resistance of the resin material, thereby limiting the application of the no-flow prepreg in the preparation of multifunctional high-end printed circuit boards.

Therefore, how to obtain a resin with excellent bonding performance, heat resistance, and small edge cracking during the process of punching has always been a difficult problem for those skilled in the art.

SUMMARY

In view of the above, the present disclosure provides a modified resin composition with excellent bonding performance, heat resistance, and small edge cracking during the process of punching, a preparation method thereof, and use thereof.

The technical solutions of the present disclosure are as follows.

In one aspect, the present disclosure provides a modified resin composition, prepared from following parts by mass of raw materials:

| | |
|---|---|
| a matrix resin | 65 to 100 parts; |
| a phenoxy resin | 10 to 40 parts; |
| nano silicon dioxide | 0.5 to 25 parts; |
| a curing agent | 2 to 15 parts; |
| a curing accelerator | 0 to 2 parts; and |
| a coupling agent | 0 to 1 part. |

In some embodiments, in the raw materials for preparing the modified resin composition, the nano silicon dioxide takes 0.5 to 15 parts by mass.

In some embodiments, the modified resin composition is prepared from following parts by mass of the raw materials:

| | |
|---|---|
| the matrix resin | 65 to 100 parts; |
| the phenoxy resin | 20 to 40 parts; |
| the nano silicon dioxide | 0.5 to 10 parts; |
| the curing agent | 5 to 15 parts; |
| the curing accelerator | 0.5 to 2 parts; and |
| the coupling agent | 0.3 to 1 part. |

In some embodiments, the matrix resin is an epoxy resin.

In some embodiments, the phenoxy resin is represented by formula (1):

(1)

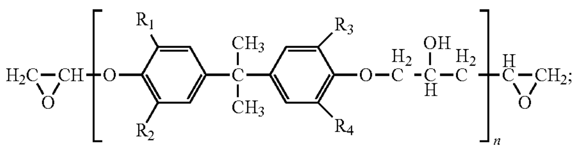

wherein n is selected from any integer in a range from 20 to 120, and $R_1$, $R_2$, $R_3$ and $R_4$ are each independently selected from the group consisting of a hydrogen atom, a halogen atom, and a phosphorus-containing group.

In some embodiments, the curing accelerator is selected from the group consisting of an imidazole curing accelerator, a peroxide curing accelerator, an azo curing accelerator, a tertiary amine curing accelerator, a phenolic curing accelerator, an organic metal salt curing accelerator, an inorganic metal salt curing accelerator, and any combinations thereof.

In another aspect, the present disclosure also provides a method for preparing the modified resin composition as described above, including following steps:

- mixing the matrix resin, the nano silicon dioxide, the coupling agent, and an organic solvent together, and heating the mixture to react, thereby obtaining a nano silicon dioxide modified matrix resin; and
- mixing the nano silicon dioxide modified matrix resin, the phenoxy resin, the curing agent, and the curing accelerator together, thereby obtaining the modified resin composition.

The present disclosure also provides a composite resin prepared from the raw materials of the modified resin composition as described above.

The present disclosure further provides a prepreg, including a reinforcement material and a resin material loaded on a surface of the reinforcement material, wherein the resin material is the composite resin as described above.

The present disclosure still further provides a printed circuit board, wherein the printed circuit board is prepared by adopting the prepreg as described above.

Beneficial Effects

In the modified resin composition provided in the present disclosure, a phenoxy resin and nano silicon dioxide at specific proportions which are synergized and cooperated with each other are adopted to modify the matrix resin. The surface of nano silicon dioxide has active silanol groups, which can be chemically grafted with the epoxy groups of the phenoxy resin and the active groups of the matrix resin, and thus Si—O—C bonds are introduced into the resin system to form an inorganic-organic backbone. After curing, dispersed elastomer particles are formed and can act as bridges or nail anchors in microcracks to prevent the formation of macrocracks, thereby achieving a good toughening effect. Meanwhile, a phenoxy resin is flow resistive to effectively reduce the flowability of the resin composition, thereby achieving the purpose of controlling the prepreg to not flow or flow very little. Moreover, the phenoxy resin has excellent mechanical properties, electrical properties, creep resistance, and strong adhesion. After curing, the prepared modified resin composition has excellent toughness, excellent processability during the process of mechanical punching, low powder loss rate, excellent bonding performance, and heat resistance, due to synergy between the gas-phase nano silicon dioxide and the phenoxy resin at specific proportions, and further cooperation of the raw materials at specific proportions. Therefore, the prepared modified resin composition can be used to prepare a printed circuit board (PCB) having high-density and multi-performances such as high temperature resistance, aging resistance, integrated circuit packaging, high-frequency, high-speed, etc., thereby facilitating the development of high-end integrated circuits.

The present disclosure also provides the composite resin prepared from the raw materials of the above-described thermosetting resin composition as described above. The composite resin has excellent bonding performance, heat resistance, and small edge cracking when being punched.

The present disclosure also provides the prepreg including the reinforcement material and the resin material loaded on the surface of the reinforcement material, wherein the resin material is the composite resin as described above. The prepreg has excellent bonding performance, heat resistance, and small edge cracking when being punched. The prepreg can be used to prepare a printed circuit board (PCB) having high-density and multi-performances, such as high temperature resistant, aging resistant, integrated circuit packaging, high-frequency, high-speed, etc., thereby facilitating the development of high-end integrated circuits.

DETAILED DESCRIPTION

For ease understanding of the present disclosure, the present disclosure will now be described thoroughly and preferred embodiments are also provided. However, the present disclosure can be implemented in many different ways and is not limited to the embodiments described herein. In contrast, these embodiments are provided for the purpose of thorough and comprehensive understanding of the present disclosure.

Unless indicated otherwise, all technical and scientific terms used herein have the same meaning as commonly understood by those skilled in the art to which the present disclosure belongs. The terms used in the description of the present disclosure is merely for the purpose of describing specific embodiments and is not intended to limit the present disclosure. As used herein, the term "and/or" includes any and all combinations of one or more of the relevant listed items.

With the development of printed wiring boards (PCBs), a no-flow prepreg is increasingly considered to be used as a bonding material between a rigid PCB and a flexible PCB. A rubber-toughened epoxy resin is usually used as the main resin material in the traditional no-flow prepreg, through which, although the prepreg that does not flow or flow very little can be obtained, the punched edge of prepreg is cracked greatly during the process of mechanical punching. This is an adverse effect on the subsequent processability and heat resistance of the resin material, thereby limiting the application of the no-flow prepreg in the preparation of multifunctional high-end printed circuit boards.

In view of the problems in the traditional art, based on years of research experiences in the field of printed circuit boards, through a large number of creative experiments and exploration, the present inventors found that: a matrix resin can be modified by a phenoxy resin and nano silicon dioxide at specific proportions to synergize and cooperate. The surface of nano silicon dioxide has active silanol groups, which can be chemically grafted with the epoxy groups of the phenoxy resin and the active groups of the matrix resin, and thus Si—O—C bonds are introduced into the resin system to form an inorganic-organic backbone. After curing, dispersed elastomer particles are formed and can act as bridges or nail anchors in microcracks to prevent the formation of macrocracks, thereby achieving a good toughening effect. After further conducting a large number of experiments and exploration, the technical solutions of the present disclosure are obtained.

In an embodiment of the present disclosure, a modified resin composition is prepared from following parts by mass of raw materials:

| | |
|---|---|
| a matrix resin | 65 to 100 parts; |
| a phenoxy resin | 10 to 40 parts; |
| nano silicon dioxide | 0.5 to 25 parts; |
| a curing agent | 2 to 15 parts; |
| a curing accelerator | 0 to 2 parts; and |
| a coupling agent | 0 to 1 part. |

In the modified resin composition as described above, a phenoxy resin and nano silicon dioxide at specific proportions which are synergized and cooperated with each other are adopted to modify the matrix resin. The surface of nano silicon dioxide has active silanol groups, which can be chemically grafted with the epoxy groups of the phenoxy resin and the active groups of the matrix resin, and thus Si—O—C bonds are introduced into the resin system to form an inorganic-organic backbone. After curing, dispersed elastomer particles are formed and can act as bridges or nail anchors in microcracks to prevent the formation of macrocracks, thereby achieving a good toughening effect. Meanwhile, the phenoxy resin is flow resistive to effectively reduce the flowability of the resin composition, thereby achieving the purpose of controlling the prepreg to not flow or flow very little. Moreover, the phenoxy resin has excellent mechanical properties, electrical properties, creep resistance, and strong adhesion. After curing, the prepared modified resin composition has excellent toughness, excellent processability during the process of mechanical punching, low powder loss rate, excellent adhesive property, and heat resistance, due to synergy between the gas-phase nano silicon dioxide and the phenoxy resin at specific proportions and further cooperation of the raw materials at specific proportions. Therefore, the prepared modified resin composition can be used to prepare a printed circuit board (PCB) having high-density and multi-performances such as high temperature resistance, aging resistance, integrated circuit packaging, high-frequency, high-speed, etc., thereby facilitating the development of high-end integrated circuits.

In some embodiments, in the raw materials for preparing the modified resin composition, the nano silicon dioxide takes 0.5 to 15 parts by mass.

Preferably, in the raw materials for preparing the modified resin composition, the nano silicon dioxide takes 0.5 to 10 parts by mass.

In some embodiments, in the raw materials for preparing the modified resin composition, the phenoxy resin takes 20 to 40 parts by mass.

In some embodiments, in the raw materials for preparing the modified resin composition, the curing agent takes 5 to 15 parts by mass.

In some embodiments, in the raw materials for preparing the modified resin composition, the curing accelerator takes 0.5 to 2 parts by mass.

In some embodiments, in the raw materials for preparing the modified resin composition, the coupling agent takes 0.3 to 1 part by mass.

In some embodiments, the modified resin composition is prepared from following parts by mass of the raw materials:

| | |
|---|---|
| the matrix resin | 65 to 100 parts; |
| the phenoxy resin | 20 to 40 parts; |
| the nano silicon dioxide | 0.5 to 10 parts; |
| the curing agent | 5 to 15 parts; |
| the curing accelerator | 0.5 to 2 parts; and |
| the coupling agent | 0.3 to 1 part. |

In some embodiments, the nano silicon dioxide as described above is prepared by a gas-phase method. That is, the nano silicon dioxide is gas-phase nano silicon dioxide.

In some embodiments, the matrix resin as described above is an epoxy resin.

In some embodiments, the matrix resin as described above is selected from the group consisting of an alicyclic epoxy resin, a hydrogenated bisphenol A epoxy resin, a glycidyl ester epoxy resin, a cyanuric acid epoxy resin, a hydantoin epoxy resin, and any combinations thereof.

When the phenoxy resin and the nano silicon dioxide at specific proportions are synergized and cooperated with each other to modify the matrix resin, the active silanol groups at the surface of nano silicon dioxide can be chemically grafted with the epoxy groups of the phenoxy resin and the epoxy resin, and thus Si—O—C bonds are introduced into the resin system to form an inorganic-organic backbone as shown below. After curing, dispersed elastomer particles are formed and can act as bridges or nail anchors in microcracks to prevent the formation of macrocracks, thereby achieving a good toughening effect.

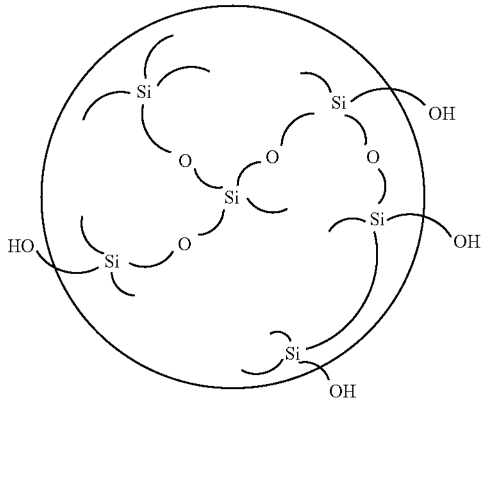

In some embodiments, the matrix resin as described above is a bismaleimide resin. Furthermore, the matrix resin as described above is selected from the group consisting of a diphenylmethane bismaleimide resin, an N-m-phenylene bismaleimide resin, a polyaminobismaleimide resin, and any combinations thereof.

When the phenoxy resin and the nano silicon dioxide at specific proportions are synergized and cooperated with each other to modify the epoxy resin, the active silanol groups at the surface of nano silicon dioxide can be chemically grafted with the epoxy groups of the phenoxy resin and with the imide groups of the bismaleimide resin, and thus Si—O—C bonds are introduced into the resin system.

In some embodiments, the phenoxy resin as described above is represented by formula (1):

(1)

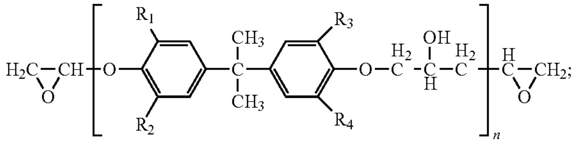

wherein n is selected from any integer in a range from 20 to 120, and $R_1$, $R_2$, $R_3$ and $R_4$ are each independently selected from the group consisting of a hydrogen atom, a halogen atom, and a phosphorus-containing group.

In some embodiments, the halogen atom as described above is bromine, and the phenoxy resin is a bromo-phenoxy resin.

In some embodiments, the phosphorus-containing group as described above is a phosphate group, and specifically is at least one of a phosphite group or a primary phosphine group.

In some embodiments, $R_1$, $R_2$, $R_3$ and $R_4$ are each a hydrogen atom.

The phenoxy resin and the nano silicon dioxide at specific proportions are synergized and cooperated to modify the matrix resin. The surface of nano silicon dioxide has active silanol groups, which can be chemically grafted with the epoxy groups of the phenoxy resin and the active groups of the matrix resin, and thus Si—O—C bonds are introduced into the resin system to form an inorganic-organic backbone. After curing, dispersed elastomer particles are formed and can act as bridges or nail anchors in microcracks to prevent the formation of macrocracks, thereby achieving a good toughening effect. Meanwhile, the phenoxy resin is flow resistive to effectively reduce the flowability of the resin composition, thereby achieving the purpose of controlling the prepreg to not flow or flow very little. Moreover, the phenoxy resin has excellent mechanical properties, electrical properties, creep resistance, and strong adhesion.

In some embodiments, the curing accelerator as described above is selected from the group consisting of an imidazole curing accelerator, a peroxide curing accelerator, an azo curing accelerator, a tertiary amine curing accelerator, a phenolic curing accelerator, an organic metal salt curing accelerator, an inorganic metal salt curing accelerator, and any combinations thereof. For example, the curing accelerator can be an imidazole curing accelerator, such as 2-methylimidazole, 2-phenylimidazole, or 2-ethyl-4-methylimidazole, or can be an organic metal salt curing accelerator, such as at least one of zinc octoate, zinc isooctoate, stannous octoate, dibutyltin dilaurate, zinc naphthenate, cobalt naphthenate, aluminum acetylacetonate, cobalt acetylacetonate, or copper acetylacetonate.

In some embodiments, the curing agent as described above is selected from the group consisting of a cyanate ester curing agent, an aliphatic polyamine curing agent, an alicyclic polyamine curing agent, an aromatic amine curing agent, a polyamide curing agent, a latent curing agent, an amine-Lewis acid complex curing agent, an organic anhydride curing agent, and any combinations thereof.

For example, the curing agent as described above can be an aliphatic polyamine curing agent, and specifically can be selected from the group consisting of ethylenediamine, diethylenetriamine, triethylenetetramine, dimethylamine propylamine, trimethylhexamethylenediamine, and any combinations thereof. Specifically, the curing agent as described above is dicyandiamide.

In the modified resin composition of the present disclosure, there is no specific requirement on the type of the coupling agent. The coupling agent can be selected from those commonly used in the art, including but not limited to: a chromium complex coupling agent, a silane coupling agent, a titanate ester coupling agent and an aluminate compound coupling agent.

In some embodiments, the coupling agent as described above is a silane coupling agent.

An embodiment of the present disclosure also provides a method for preparing the modified resin composition as described above. The method comprises steps S10 to S20.

In step S10, the matrix resin, nano silicon dioxide, the coupling agent, and an organic solvent are mixed together, and then heated to react, thereby obtaining a nano silicon dioxide modified matrix resin.

In some embodiments, the mixture is heated at 100° C. to 200° C. for 2 hours to 3 hours to complete the reaction.

When the matrix resin is an epoxy resin, the nano silicon dioxide modified epoxy resin is obtained in step S10, with the reaction mechanism as follows.

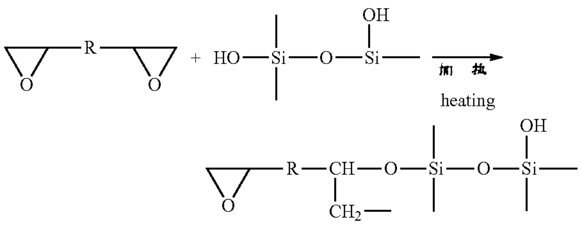

In step S20, the nano silicon dioxide modified matrix resin, the phenoxy resin, the curing agent, and the curing accelerator are mixed together, thereby obtaining the modified resin composition.

In some embodiments, an organic solvent is added in step S20, to obtain an adhesive solution of the modified resin composition.

The organic solvent used in steps S10 and S20 can be selected from the same range, and can be at least one of dimethylformamide or dimethylacetamide. Furthermore, the organic solvent is dimethylformamide.

Further, the present disclosure also provides a composite resin prepared from the raw materials of the any one of the modified resin compositions as described above.

The composite resin has excellent bonding performance, heat resistance, and small edge cracking when being punched, and in particularly has high bonding strength with polyimide, which is a material of flexible PCBs.

An embodiment of the present disclosure also provides a prepreg, including a reinforcement material and a resin material loaded on a surface of the reinforcement material, wherein the resin material is the composite resin as described above.

In some embodiments, the reinforcement material is selected from the group consisting of an inorganic fiber material, an organic fiber material, and any combinations thereof.

The prepreg has excellent bonding performance, heat resistance, and small edge cracking when being punched, and can be used to prepare a printed circuit board (PCB) with high-density and multi-performances, such as high temperature resistance, aging resistance, integrated circuit packaging, high-frequency, high-speed, etc., thereby facilitating the development of high-end integrated circuits.

The inorganic fiber material as described above includes but not limit to glass fibers, carbon fibers, silicon carbide fibers, asbestos fibers, etc. The organic fiber material as described above includes but not limit to nylon, ultra-high molecular weight polyethylene fibers, aramid fibers, polyimide fibers, polyester fibers, cotton fibers, etc.

The glass fibers include different types of glass fibers, such as E-glass fibers, NE-glass fibers, D-glass fibers, S-glass fibers, T-glass fibers, etc.

Further, a method for preparing the prepreg as described above includes the following steps S30 and S40.

Step S30, the thermosetting resin as described above is prepared as a resin adhesive solution.

Step S40, the reinforcement material is immersed in the resin adhesive solution obtained in step S30, and then taken out, heated and cured to obtain the prepreg.

In some embodiments, the immersion in step S40 is at room temperature for 10 seconds.

In some embodiments, in step S40 the reinforcement material is heated at 130° C. to 250° C. for 2 minutes to 10 minutes.

Further, an embodiment of the present disclosure also provides a printed circuit board, wherein the printed circuit board is prepared by adopting the prepreg as described above.

In some embodiments, the printed circuit board further includes a rigid circuit board and a flexible circuit board. Further, the prepreg as described above is adopted to prepare a bonding layer between the rigid circuit board and the flexible circuit board.

The printed circuit board as described above has high density and multi-performances, and can meet the requirements of three-dimensional installation of electronic products, thereby facilitating the development of high-end integrated circuits.

The present disclosure will now be described in detail with reference to specific embodiments, but the present disclosure is not limited to these embodiments. It should be understood that the scope of the present disclosure is generalized by the appended claims. Those skilled in the art know that any modifications made under the guidance of the conception of the present disclosure are all covered by the spirit and scope of the claims of the present disclosure.

EXAMPLES

Example 1

1) 0.3 parts by mass of a silane coupling agent, 100 parts by mass of a matrix resin (an epoxy resin) and 3 parts by mass of dimethylformamide were added in a dry four-neck flask equipped with a stirrer and a thermometer, stirred while heated to 150° C. Then 0.5 parts by mass of gas-phase nano silicon dioxide was added under stirring condition, reacted for 2 hours while the temperature is kept, and cooled to obtain a nano silicon dioxide modified epoxy resin.

2) 5 parts by mass of dicyandiamide and 100 parts by mass of dimethylformamide were added in a bottle and stirred thoroughly to dissolve. 10 parts by mass of a phenoxy resin, the nano silicon dioxide modified epoxy resin obtained in step 1), and 0.5 parts by mass of 2-methylimidazole were added successively in the bottle, and stirred evenly to prepare an adhesive solution.

3) 1078 glass fiber cloth with a weight of 47.5 g/$m^2$ was immersed in the adhesive solution obtained in step 2) at room temperature for 10 seconds, and was taken out and dried in a hot air circulating oven at 180° C. for 3 minutes, to obtain a no-flow prepreg with a resin content of (65±1) wt %.

Example 2

1) 0.3 parts by mass of a silane coupling agent, 100 parts by mass of a matrix resin (an epoxy resin) and 3 parts by mass of dimethylformamide were added in a dry four-neck flask equipped with a stirrer and a thermometer, stirred while heated to 150° C. Then 0.5 parts by mass of gas-phase nano silicon dioxide was added under stirring condition, reacted for 2 hours while the temperature is kept, and cooled to obtain a nano silicon dioxide modified epoxy resin.

2) 5 parts by mass of dicyandiamide and 100 parts by mass of dimethylformamide were added in a bottle and stirred thoroughly to dissolve. 40 parts by mass of a phenoxy resin, the nano silicon dioxide modified epoxy resin obtained in step 1), and 0.5 parts by mass of 2-methylimidazole were added successively in the bottle, and stirred evenly to prepare an adhesive solution.

3) 1078 glass fiber cloth with a weight of 47.5 g/$m^2$ was immersed in the adhesive solution obtained in step 2) at room temperature for 10 seconds, and was taken out and dried in a hot air circulating oven at 180° C. for 3 minutes, to obtain a no-flow prepreg with a resin content of (65±1) wt %.

Example 3

1) 0.3 parts by mass of a silane coupling agent, 100 parts by mass of a matrix resin (an epoxy resin) and 3 parts by mass of dimethylformamide were added in a dry four-neck flask equipped with a stirrer and a thermometer, stirred while heated to 150° C. Then 25 parts by mass of gas-phase nano silicon dioxide was added under stirring condition, reacted for 2 hours while the temperature is kept, and cooled to obtain a nano silicon dioxide modified epoxy resin.

2) 5 parts by mass of dicyandiamide and 100 parts by mass of dimethylformamide were added in a bottle and stirred thoroughly to dissolve. 10 parts by mass of a phenoxy resin, the nano silicon dioxide modified epoxy resin obtained in step 1), and 0.5 parts by mass of 2-methylimidazole were added successively in the bottle, and stirred evenly to prepare an adhesive solution.

3) 1078 glass fiber cloth with a weight of 47.5 g/$m^2$ was immersed in the adhesive solution obtained in step 2) at room temperature for 10 seconds, and was taken out and dried in a hot air circulating oven at 180° C. for 3 minutes, to obtain a no-flow prepreg with a resin content of (65±1) wt %.

Example 4

1) 0.3 parts by mass of a silane coupling agent, 100 parts by mass of a matrix resin (an epoxy resin) and 3 parts by mass of dimethylformamide were added in a dry four-neck flask equipped with a stirrer and a thermometer, stirred while heated to 150° C. Then 25 parts by mass of gas-phase nano silicon dioxide was added under stirring condition, reacted for 2 hours while the temperature is kept, and cooled to obtain a nano silicon dioxide modified epoxy resin.

2) 5 parts by mass of dicyandiamide and 100 parts by mass of dimethylformamide were added in a bottle and stirred thoroughly to dissolve. 40 parts by mass of a phenoxy resin, the nano silicon dioxide modified epoxy resin obtained in step 1), and 0.5 parts by mass of 2-methylimidazole were added successively in the bottle, and stirred evenly to prepare an adhesive solution.

3) 1078 glass fiber cloth with a weight of 47.5 g/$m^2$ was immersed in the adhesive solution obtained in step 2) at room temperature for 10 seconds, and was taken out and dried in a hot air circulating oven at 180° C. for 3 minutes, to obtain a no-flow prepreg with a resin content of (65±1) wt %.

Example 5

1) 0.3 parts by mass of a silane coupling agent, 100 parts by mass of a matrix resin (an epoxy resin) and 3 parts by mass of dimethylformamide were added in a dry four-neck flask equipped with a stirrer and a thermometer, stirred while heated to 150° C. Then 10 parts by mass of gas-phase nano silicon dioxide was added under stirring condition, reacted for 2 hours while the temperature is kept, and cooled to obtain a nano silicon dioxide modified epoxy resin.

2) 5 parts by mass of dicyandiamide and 100 parts by mass of dimethylformamide were added in a bottle and stirred thoroughly to dissolve. 10 parts by mass of a phenoxy resin, the nano silicon dioxide modified epoxy resin obtained in step 1), and 0.5 parts by mass of 2-methylimidazole were added successively in the bottle, and stirred evenly to prepare an adhesive solution.

3) 1078 glass fiber cloth with a weight of 47.5 g/$m^2$ was immersed in the adhesive solution obtained in step 2) at room temperature for 10 seconds, and was taken out and dried in a hot air circulating oven at 180° C. for 3 minutes, to obtain a no-flow prepreg with a resin content of (65±1) wt %.

Example 6

1) 0.3 parts by mass of a silane coupling agent, 100 parts by mass of a matrix resin (an epoxy resin) and 3 parts by mass of dimethylformamide were added in a dry four-neck flask equipped with a stirrer and a thermometer, stirred while heated to 150° C. Then 15 parts by mass of gas-phase nano silicon dioxide was added under stirring condition, reacted for 2 hours while the temperature is kept, and cooled to obtain a nano silicon dioxide modified epoxy resin.

2) 5 parts by mass of dicyandiamide and 100 parts by mass of dimethylformamide were added in a bottle and stirred thoroughly to dissolve. 10 parts by mass of a phenoxy resin, the nano silicon dioxide modified epoxy resin obtained in step 1), and 0.5 parts by mass of 2-methylimidazole were added successively in the bottle, and stirred evenly to prepare an adhesive solution.

3) 1078 glass fiber cloth with a weight of 47.5 g/$m^2$ was immersed in the adhesive solution obtained in step 2) at room temperature for 10 seconds, and was taken out and dried in a hot air circulating oven at 180° C. for 3 minutes, to obtain a no-flow prepreg with a resin content of (65±1) wt %.

Comparative Example 1

1) 5 parts by mass of dicyandiamide and 100 parts by mass of dimethylformamide were added in a bottle and stirred thoroughly to dissolve. Then 100 parts by mass of a matrix resin (an epoxy resin) and 50 parts by mass of a phenoxy resin were added in the bottle. 0.3 parts by mass of a silane coupling agent, 25 parts by mass of normal silicon dioxide, and 0.5 parts by mass of 2-methylimidazole were further added under stirring condition, and the mixture was continued to be stirred evenly to prepare an adhesive solution.

2) 1078 glass fiber cloth with a weight of 47.5 g/$m^2$ was immersed in the adhesive solution obtained in step 1) at room temperature for 10 seconds, and was taken out and dried in a hot air circulating oven at 180° C. for 3 minutes, to obtain a no-flow prepreg with a resin content of (65±1) wt %.

Comparative Example 2

1) 6 parts by mass of dicyandiamide and 100 parts by mass of dimethylformamide were added in a bottle and stirred thoroughly to dissolve. Then 100 parts by mass of a matrix resin (an epoxy resin) and 20 parts by mass of a phenoxy resin, and 20 parts by mass of a CTBN modified epoxy resin were added in the bottle. 0.3 parts by mass of a silane coupling agent, 25 parts by mass of normal silicon dioxide, and 0.5 parts by mass of 2-methylimidazole were further added under stirring condition, and the mixture was continued to be stirred evenly to prepare an adhesive solution.

2) 1078 glass fiber cloth with a weight of 47.5 g/$m^2$ was immersed in the adhesive solution obtained in step 2) at room temperature for 10 seconds, and was taken out and dried in a hot air circulating oven at 180° C. for 3 minutes, to obtain a no-flow prepreg with a resin content of (65±1) wt %.

Comparative Example 3

1) 0.3 parts by mass of a silane coupling agent, 100 parts by mass of a matrix resin (an epoxy resin) and 3 parts by mass of dimethylformamide were added in a dry four-neck flask equipped with a stirrer and a thermometer, stirred while heated to 150° C. Then 30 parts by mass of gas-phase nano silicon dioxide was added under stirring condition, reacted for 2 hours while the temperature is kept, and cooled to obtain a nano silicon dioxide modified epoxy resin.

2) 5 parts by mass of dicyandiamide and 100 parts by mass of dimethylformamide were added in a bottle and stirred thoroughly to dissolve. 5 parts by mass of a phenoxy resin, the nano silicon dioxide modified epoxy resin obtained in step 1), and 0.5 parts by mass of 2-methylimidazole were added successively in the bottle, and stirred evenly to prepare an adhesive solution.

3) 1078 glass fiber cloth with a weight of 47.5 g/$m^2$ was immersed in the adhesive solution obtained in step 2) at room temperature for 10 seconds, and was taken out and dried in a hot air circulating oven at 180° C. for 3 minutes, to obtain a no-flow prepreg with a resin content of (65±1) wt %.

The above raw materials are all commercially available.

The matrix resin (epoxy resin) was purchased from Nan Ya Epoxy Resin (Kunshan) Co., Ltd, with the product model of NPEL-128.

The phenoxy resin was purchased from Shandong Shengquan New Materials Co., Ltd, with the product model of SQP-40AXM40.

The CTBN modified epoxy resin was purchased from Complex Chemistry (Shanghai) Co., Ltd, with the product model of EPC-240.

The silane coupling agent was purchased from Nanjing Shuguang Chemical Group Co., Ltd, with the product model of SG-Si 121.

The gas-phase nano silicon dioxide was purchased from Douwar Chemicals (Shanghai) Co., Ltd, with the product model of L20.

The normal silicon dioxide was purchased from Chongqing Jingyi Silicon Material Co., Ltd, with the product model of M10.

The raw materials of Examples 1 to 6 and Comparative Examples 1 to 3 are shown in Table 1.

TABLE 1

| Component | Example 1 | Example 2 | Example 3 | Example 4 | Example 5 | Example 6 | Comparative Example 1 | Comparative Example 2 | Comparative Example 3 |
|---|---|---|---|---|---|---|---|---|---|
| CTBN modified epoxy resin | 0 | 0 | 0 | 0 | 0 | 0 | 0 | 20 | 0 |
| Phenoxy resin | 10 | 40 | 10 | 40 | 20 | 30 | 50 | 20 | 5 |
| Matrix resin | 100 | 100 | 100 | 100 | 100 | 100 | 100 | 100 | 100 |
| Dicyandiamide | 5 | 5 | 5 | 5 | 5 | 5 | 5 | 6 | 5 |
| 2-methylimidazole | 0.5 | 0.5 | 0.5 | 0.5 | 0.5 | 0.5 | 0.5 | 0.5 | 0.5 |
| Silane coupling agent | 0.3 | 0.3 | 0.3 | 0.3 | 0.3 | 0.3 | 0.3 | 0.3 | 0.3 |
| Gas-phase nano silicon dioxide | 0.5 | 0.5 | 25 | 25 | 10 | 15 | 0 | 0 | 30 |
| Normal silicon dioxide | 0 | 0 | 0 | 0 | 0 | 0 | 25 | 25 | 0 |

In Comparative Example 3, due to the proportions of the raw materials were beyond the specific range, the gas-phase nano silicon dioxide was aggregated, unevenly dispersed and abnormally precipitated during the process of modification, which affected the compatibility of the components. Therefore, modification to the material was incomplete, and the composition had larger resin flow, smaller peel strength, larger powder loss rate, larger edge cracking when being punched, and poorer heat resistance to tin immersion.

Performances of the no-flow prepregs obtained in Examples 1 to 6 and Comparative Examples 1 to 3 were tested, and the results are shown in table 2 as follows.

TABLE 2

| Test items | Resin flow (mm) | Peel strength (N/mm) | Powder loss rate (%) | Cracking length of punched edge (mm) | Heat resistance to tin immersion at 288° C. (s) |
|---|---|---|---|---|---|
| Example 1 | 0.65 | 1.12 | 0.25 | 0.20 | >300 |
| Example 2 | 0.70 | 1.31 | 0.22 | 0.17 | >300 |
| Example 3 | 0.58 | 1.45 | 0.15 | 0.10 | >300 |
| Example 4 | 0.55 | 1.52 | 0.14 | 0.09 | >300 |
| Example 5 | 0.63 | 1.38 | 0.18 | 0.13 | >300 |
| Example 6 | 0.60 | 1.40 | 0.16 | 0.10 | >300 |
| Comparative Example 1 | 0.62 | 1.05 | 0.50 | 0.80 | >300 |
| Comparative Example 2 | 0.65 | 0.87 | 0.32 | 0.43 | >300 |
| Comparative Example 3 | 0.92 | 0.84 | 0.55 | 0.48 | 155 |

The test methods were as follows.

1) The peel strength was determined according to IPC-TM-650 2.4.8, using polyimide material as the substrate.
2) The powder loss rate was determined based on the degree of resin powder loss after punching/shearing treatment of the prepregs. Taking the prepregs prepared in Example 1 as an example, the specific test was as follows.

Four prepregs each with a size of 10 cm×10 cm prepared in Example 1 were weighed and recorded as m1, respectively. For each prepreg, 29 notches with a depth of 9 cm were cut on one side by using scissors, thereby forming 30 strips with a length of 9 cm in each prepreg. Each prepreg was treated in the same way.

The prepared sample was held with one hand and vibrated up and down with the wrist as the center for 30 times, and one up and down movement was recorded as one time of vibration. After finished, the sample was weighed again and recorded as m2. The powder loss rate of the prepreg was calculated as (m1−m2)/m1×100%. Each sample was treated in the same way, and its powder loss rate was calculated. Then the powder loss rate of the prepreg of Example 1 was calculated as follows.

The powder loss rate of the prepreg of Example 1=sum of the powder loss rates of the four prepregs/4.

3) The resin flow was determined according to IPC-TM-650 2.3.17.2.
4) The heat resistance was determined according to IPC-TM-650 2.4.13.1.
5) The cracking length of the punched edge was determined as follows.

The prepreg was punched with a sampler used for resin content testing, and the punched sample was placed under a 50× magnifying glass to measure the cracking length.

It can be seen from the test results of Table 2, according to the technical solution of the present disclosure, the prepared prepregs have excellent bonding performance, heat resistance, and small edge cracking when being punched. The prepared prepregs are not prone to have molecular chain motion at high temperature and high pressure, and thus can achieve no resin flow or little resin flow under high temperature and high pressure. In Comparative Examples 1 and 2, the matrix resin was modified with a traditional rubber modified epoxy resin (a CTBN modified epoxy resin) and a phenoxy resin, and normal silicon dioxide was used as an inorganic filler, so that the prepared no-flow prepregs have poor bonding performance, low peeling strength (PI), large edge cracking when being punched, and high powder loss rate.

Compared with Example 3, the prepreg in Comparative Example 3 was prepared from gas-phase nano silicon dioxide beyond the proportional range of the present disclosure and a phenoxy resin with reduced proportion. The prepared prepreg in Comparative Example 3 has large edge cracking when being punched, high powder loss rate, and poor peeling strength (PI). Moreover, the excessive gas-phase nano silicon dioxide is prone to aggregate, unevenly disperse and abnormally precipitate.

The above-described embodiments are only several implementations of the present disclosure, and the descriptions are relatively specific and detailed, but they should not be construed as limiting the scope of the present disclosure. It should be understood by those of ordinary skill in the art that various modifications and improvements can be made without departing from the concept of the present disclosure, and all fall within the protection scope of the present disclosure. Therefore, the patent protection of the present disclosure shall be defined by the appended claims.

What is claimed is:

1. A modified resin composition, prepared from following parts by mass of raw materials comprising:

| | |
|---|---|
| a matrix resin | 65 to 100 parts; |
| a phenoxy resin | 10 to 40 parts; |
| nano silicon dioxide | 0.5 to 25 parts; |
| a curing agent | 2 to 15 parts; |
| a curing accelerator | 0 to 2 parts; and |
| a coupling agent | greater than 0 and equal to or less than 1 part |

wherein the matrix resin is an epoxy resin; a surface of the nano silicon dioxide has active silanol groups; and the phenoxy resin is represented by formula (1);

(1)

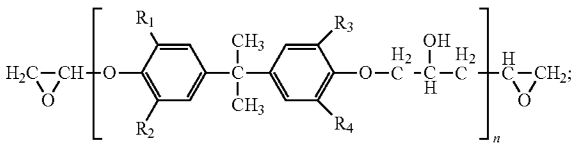

wherein n is selected from any integer of in a range from 20 to 120, and $R_1$, $R_2$, $R_3$ and $R_4$ are each independently selected from the group consisting of a hydrogen atom, a halogen atom, a phosphorus-containing group, and any combinations thereof.

2. The modified resin composition of claim 1, wherein in the raw materials, the nano silicon dioxide takes 0.5 to 15 parts by mass.

3. The modified resin composition of claim 1, wherein the modified resin composition is prepared from following parts by mass of the raw materials comprising:

| | |
|---|---|
| the matrix resin | 65 to 100 parts; |
| the phenoxy resin | 20 to 40 parts; |
| the nano silicon dioxide | 0.5 to 10 parts; |
| the curing agent | 5 to 15 parts; |
| the curing accelerator | 0.5 to 2 parts; and |
| the coupling agent | 0.3 to 1 part. |

4. The modified resin composition of claim 1, wherein the curing accelerator is selected from the group consisting of an imidazole curing accelerator, a peroxide curing accelerator, an azo curing accelerator, a tertiary amine curing accelerator, a phenolic curing accelerator, an organic metal salt curing accelerator, an inorganic metal salt curing accelerator and any combinations thereof.

5. The modified resin composition of claim 1, wherein in the raw materials, the phenoxy resin takes 20 to 40 parts by mass.

6. The modified resin composition of claim 1, wherein in the raw materials, the curing agent takes 5 to 15 parts by mass.

7. The modified resin composition of claim 1, wherein in the raw materials, the coupling agent takes 0.3 to 1 part by mass.

8. The modified resin composition of claim 1, wherein the halogen atom is bromine, or the phosphorus-containing group is a phosphate group.

9. The modified resin composition of claim 1, wherein $R_1$, $R_2$, $R_3$ and $R_4$ are each a hydrogen atom.

10. The modified resin composition of claim 1, wherein the matrix resin is selected from the group consisting of an alicyclic epoxy resin, a hydrogenated bisphenol A epoxy resin, a glycidyl ester epoxy resin, a cyanuric acid epoxy resin, a hydantoin epoxy resin, and any combinations thereof.

11. The modified resin composition of claim 1, wherein the curing accelerator is selected from the group consisting of 2-methylimidazole, 2-phenylimidazole, 2-ethyl-4-methylimidazole, zinc octoate, zinc isooctoate, stannous octoate, dibutyltin dilaurate, zinc naphthenate, cobalt naphthenate, aluminum acetylacetonate, cobalt acetylacetonate, copper acetylacetonate, and any combinations thereof.

12. The modified resin composition of claim 1, wherein the curing agent is selected from the group consisting of a cyanate ester curing agent, an aliphatic polyamine curing agent, an alicyclic polyamine curing agent, an aromatic amine curing agent, a polyamide curing agent, a latent curing agent, an amine-Lewis acid complex curing agent, an organic anhydride curing agent, and any combinations thereof.

13. The modified resin composition of claim 1, wherein the curing agent is selected from the group consisting of ethylenediamine, diethylenetriamine, triethylenetetramine, dimethylamine propylamine, trimethylhexamethylenediamine, and any combinations thereof.

14. The modified resin composition of claim 1, wherein the coupling agent is selected from the group consisting of a chromium complex coupling agent, a silane coupling agent, a titanate ester coupling agent, an aluminate compound coupling agent, and any combinations thereof.

15. The modified resin composition of claim 1, wherein at least one of $R_1$, $R_2$, $R_3$, and $R_4$ is a phosphorus-containing group.

16. A method for preparing the modified resin composition of claim 1, comprising following steps of:

mixing the matrix resin, the nano silicon dioxide, the coupling agent, and an organic solvent together, and heating the mixture to react, thereby obtaining a nano silicon dioxide modified matrix resin; and mixing the nano silicon dioxide modified matrix resin, the phenoxy resin, the curing agent, and the curing accelerator together, thereby obtaining the modified resin composition.

17. A composite resin prepared from the raw materials of the modified resin composition of claim 1.

18. A prepreg comprising a reinforcement material and a resin material loaded on a surface of the reinforcement material, wherein the resin material is the composite resin of claim 17.

19. A printed circuit board, wherein the printed circuit board is prepared by adopting the prepreg of claim 18.

* * * * *